US010854482B2

(12) United States Patent
Li et al.

(10) Patent No.: US 10,854,482 B2
(45) Date of Patent: Dec. 1, 2020

(54) REACTION CHAMBER AND PLASMA PROCESSING APPARATUS

(71) Applicant: BEIJING NAURA MICROELECTRONICS EQUIPMENT CO., LTD., Beijing (CN)

(72) Inventors: Xingcun Li, Beijing (CN); Gang Wei, Beijing (CN); Dongsan Li, Beijing (CN); Changle Guan, Beijing (CN); Mingda Qiu, Beijing (CN); Longchao Zhao, Beijing (CN); Mingming Song, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 535 days.

(21) Appl. No.: 15/119,525

(22) PCT Filed: Dec. 3, 2014

(86) PCT No.: PCT/CN2014/092878
§ 371 (c)(1),
(2) Date: Aug. 17, 2016

(87) PCT Pub. No.: WO2015/124014
PCT Pub. Date: Aug. 27, 2015

(65) Prior Publication Data
US 2017/0011938 A1      Jan. 12, 2017

(30) Foreign Application Priority Data

Feb. 24, 2014   (CN) .......................... 2014 1 0063219

(51) Int. Cl.
*H01L 21/67* (2006.01)
*H01J 37/32* (2006.01)

(52) U.S. Cl.
CPC .... *H01L 21/67069* (2013.01); *H01J 37/3211* (2013.01); *H01J 37/32119* (2013.01); *H01J 37/32449* (2013.01); *H01J 2237/334* (2013.01)

(58) Field of Classification Search
CPC ............ H01J 2237/334; H01J 37/3211; H01J 37/32119; H01J 37/32449; H01L 21/67069
See application file for complete search history.

(56) References Cited

U.S. PATENT DOCUMENTS 5,964,949 A * 10/1999 Savas ................ H01J 37/32082
6,573,190 B1   6/2003 Izawa et al.
(Continued)

FOREIGN PATENT DOCUMENTS

CN      101043784 A      9/2007
CN      101218859 A      7/2008
(Continued)

OTHER PUBLICATIONS

PCT/CN2014/092878 International Search Report dated Mar. 6, 2015; 2 pgs.

*Primary Examiner* — Hua Qi
(74) *Attorney, Agent, or Firm* — Anova Law Group, PLLC

(57) ABSTRACT

A reaction chamber is provided. The reaction chamber includes a chamber body, a dielectric window, and a power supplier. The dielectric window is provided on top of the chamber body along a first direction and hermetically connected with the chamber body. Each coil of a plurality of sets of coils is wound around an outer surface of the dielectric window at an interval along the first direction. The plurality of sets of coils are connected in parallel, with first ends (Continued)

electrically coupled to the power supplier for supplying power to each set of the plurality of sets of coils, and with second ends grounded. The second ends of the plurality of sets of coils are arranged in proximity between the first ends.

7 Claims, 3 Drawing Sheets

(56) References Cited

U.S. PATENT DOCUMENTS

| | | | |
|---|---|---|---|
| 2006/0214059 A1 | 9/2006 | Smith | |
| 2007/0221331 A1* | 9/2007 | Lee | H01J 37/321 |
| | | | 156/345.38 |
| 2008/0210378 A1* | 9/2008 | Lee | H05H 1/46 |
| | | | 156/345.49 |
| 2012/0247679 A1* | 10/2012 | Yamazawa | H01J 37/3244 |
| | | | 156/345.48 |

FOREIGN PATENT DOCUMENTS

| | | |
|---|---|---|
| CN | 101543141 A | 9/2009 |
| CN | 102549725 A | 7/2012 |
| JP | H07263188 A | 10/1995 |
| JP | H08263188 A | 10/1996 |
| KR | 20070010628 A | 1/2007 |
| KR | 20070096205 A | 10/2007 |
| TW | 201250765 A1 | 12/2012 |

* cited by examiner

REACTION CHAMBER AND PLASMA PROCESSING APPARATUS

CROSS REFERENCE TO RELATED APPLICATION

This application claims the benefit of and priority to PCT/CN2014/092878, filed on Dec. 3, 2014, entitled (translation), "REACTION CHAMBER AND PLASMA PROCESSING APPARATUS," which claims the benefit of and priority to Chinese Patent Application No. 201410063219.6, filed on Feb. 24, 2014, of which is entitled (translation), "REACTION CHAMBER AND PLASMA PROCESSING APPARATUS," and which are hereby incorporated by reference in their entirety into this application.

BACKGROUND

Field of the Invention

Embodiments of the invention relate to the field of semiconductor apparatus fabrication, and particularly relate to a reaction chamber and a plasma processing apparatus.

Description of the Related Art

TSV (Through Silicon Vias) interconnection technology is widely used in processes such as 3D stacked package, MEMS (Micro-electromechanical Systems) package, and the like. In the TSV process, in order to achieve relatively high etching selectivity and etching rate, a remote high density plasma (thereinafter referred to as a remote HDP) source is generally adopted, that is, a wafer is positioned downstream of plasma and keeps a relatively large distance from a coil for generating plasma, so that an area where the wafer is positioned has high free radical concentration but low ion density, which can reduce loss of a mask layer due to ion bombardment, thereby achieving both high etching; rate and decent etching selectivity.

FIG. 1 is a schematic diagram of an existing reaction chamber. As shown in FIG. 1, the reaction chamber 1 includes an electrostatic chuck 2, a dielectric window 3, a coil 4, a first power supply 5 and a second power supply 6. The electrostatic chuck 2 is provided at the bottom region in the reaction chamber 1, and is used for holding a wafer. The dielectric window 3 is positioned vertically above the electrostatic chuck 2 and keeps a relatively large distance from the electrostatic chuck 2. The coil 4 is wound around the dielectric window 3 at an outer side thereof, and is electrically connected to the first power supply 5; the first power supply 5 supplies power to the coil 4, so that the coil generates an electromagnetic field in the reaction chamber 1, which excites process gas introduced into the reaction chamber 1 into plasma. The second power supply 6 is electrically connected to the electrostatic chuck 2, and is used for supplying power to the electrostatic chuck 2 to generate a bias voltage on the electrostatic chuck 2, so as to attract the plasma to bombard the wafer placed on the electrostatic chuck 2, so that a physical reaction and/or a chemical reaction happens between the plasma and the wafer, thereby implementing an etching process on the wafer.

In the above reaction chamber 1, because both inductive coupling and capacitive coupling exist between the coil 4 and the plasma, and power consumed by the capacitive coupling is generally 50% of that consumed by the inductive coupling, the first power supply 5 needs to supply higher power to the coil 4 to obtain a large density of plasma in the area where the wafer is positioned in the reaction chamber 1, so as to achieve a relatively high etching rate. In this case, because skin current resulted from skin effect increases rapidly and has a direction opposite to that of current in the coil 4, a part of the power supplied to the coil 4 by the first power supply 5 is consumed, which reduces effective power of the coil 4 for generating an electromagnetic field and exciting plasma. In the meanwhile, when the first power supply 5 supplies higher power to the coil 4, strengths of effects such as recombination of active particles in the plasma, ion bombardment on the dielectric window, optical radiation, and the like are enhanced, which results in higher temperature rise of the dielectric window 3, and larger temperature gradient on the dielectric window 3, and thus the dielectric window 3 is more prone to crack.

SUMMARY

Embodiments of the invention are intended to solve at least one of the technical problems existing in the convention art discussed above, and provide a reaction chamber having plural sets of coils and a plasma processing apparatus, so that skin current effect caused by a single set of coil can be reduced, further more of the power applied to the coil is allowed to be used for exciting plasma, and ionization rate of process gas is improved; in the meanwhile, uniformity of distribution of plasma is improved macroscopically; as a result, strengths of effects such as recombination of active particles in the plasma, ion bombardment on the dielectric window, optical radiation, and the like are reduced, and further temperature rise and temperature gradient in the dielectric window during the process is reduced, thereby decreasing possibility of the cracking of the dielectric window and prolonging service life of the dielectric window as well.

According to at least one embodiment, there is provided a reaction chamber, including a chamber body, a dielectric window, and a power supply Unit, wherein the dielectric window is provided above the chamber body and is hermetically connected with the chamber body, an outer side of the dielectric window is provided thereon with a plurality of sets of coils arranged at an interval in a vertical direction and wound around the dielectric window, and the power supply unit supplies power to the plurality of sets of coils.

According to at least one embodiment, the power supply unit includes a power supply and a matcher, and the plurality of sets of coils are connected to the power supply via the matcher.

According to at least one embodiment, a number of the power supply is one, the plurality of sets of coils are connected in parallel and electrically connected to the power supply, and winding directions of the plurality of sets of coils are the same, so that a current in each sot of coil has a same direction when the power supply supplies power to the plurality of sets of coils.

According to at least one embodiment, a number of the power supplies is plural, a number of the matchers corresponds to the number of the power supplies, and each power supply is electrically connected to one set of coil via one matcher; currents in the plurality of sets of coils have a same direction when the power supplies supply power to the coils.

According to at least one embodiment, a number of the power supplies is plural, a number of the matchers corresponds to the number of the power supplies, and each power supply is electrically connected to more than one set of coil via one matcher; for each power supply, a winding direction of the more than one set of coil corresponding thereto is the same, so that a current in each set of coil has a same direction when the power supply supplies power to the more than more set of coil.

According to at least one embodiment, the reaction chamber includes a first connection member, a second connection member, a third connection member and a fourth connection member, wherein the first connection member and the second connection member are arranged in a vertical direction, the plurality of sets of coils have first ends connected to the first connection member, and second ends connected to the second connection member, the third connection member have two ends respectively connected to the power supply and the first connection member, and the fourth connection member has one end connected to the second connection member and the other end grounded.

According to at least one embodiment, a position of the first member at which the first connection member is connected to the third connection member and a position of the second connection member at which the second connection member is connected to the fourth connection member are set according to currents required by the plurality of sets of coils.

According to at least one embodiment, one end of the third connection member is connected to a middle position of the first connection member; and one end of the fourth connection member is connected to a middle position of the second connection member.

According to at least one embodiment, the number of turns in each set of coil is plural, and a spacing between two adjacent sets of coils is at least twice as long as that between two adjacent turns of the coil in each set of coil.

According to another embodiment, there is provided a plasma processing apparatus, including a reaction chamber, which is the above reaction chamber provided by various embodiments of the invention generally discussed above and in detail below.

BRIEF DESCRIPTION OF THE DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Advantages and features of the invention and methods of accomplishing the same will be apparent by referring to embodiments described below in detail in connection with the accompanying drawings. However, the invention is not limited to the embodiments disclosed below and may be implemented in various different forms. The embodiments are provided only for completing the disclosure of the invention and for fully representing the scope of the invention to those skilled in the art.

Figure 1:
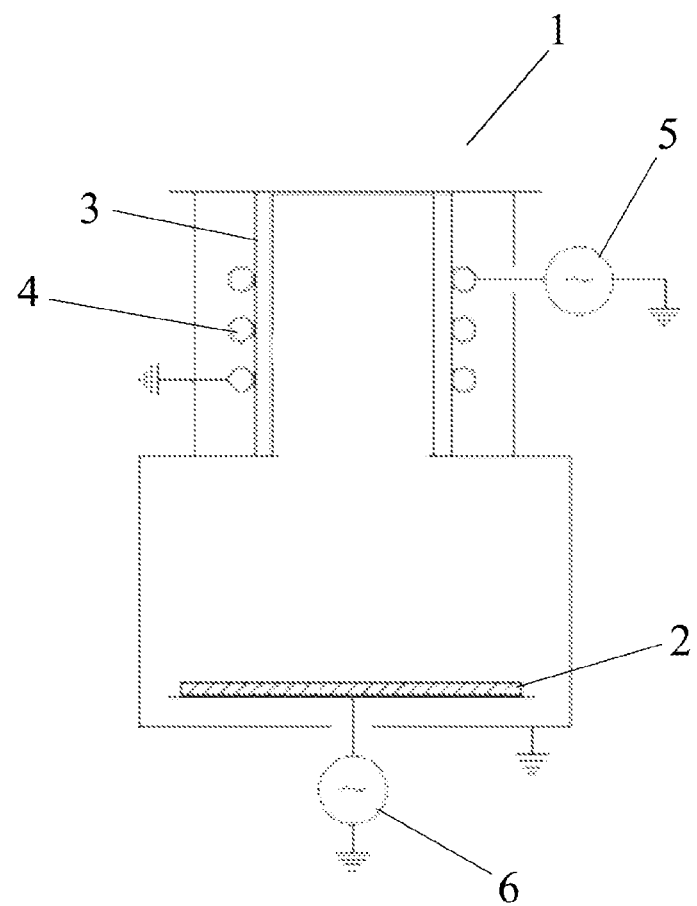
FIG. 1 is a schematic diagram of an existing reaction chamber.
Figure 2:
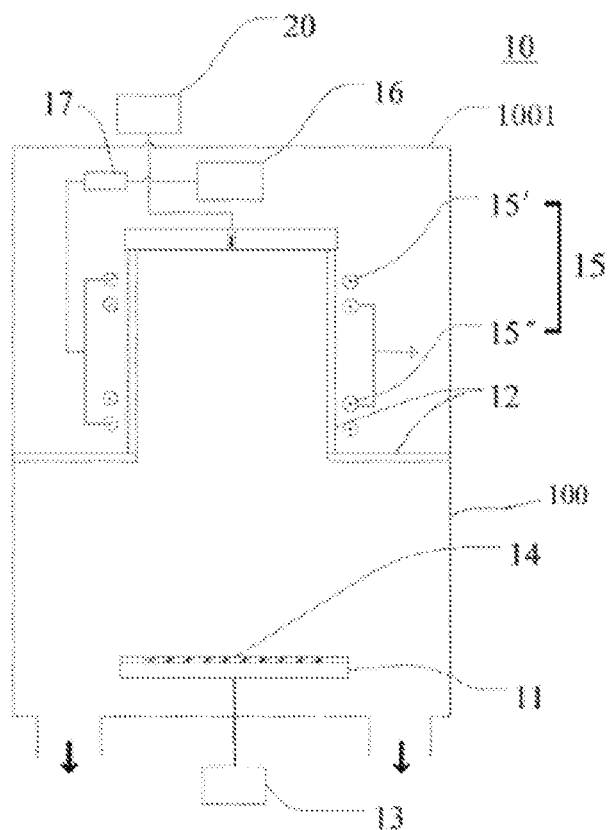
FIG. 2 is a schematic structural diagram of a reaction chamber according to an embodiment of the invention.

Referring to FIG. 2, FIG. 2 is a schematic structural diagram of a reaction chamber according to an embodiment of the invention. The reaction chamber 10 is used for processing a to-be-processed workpiece 14, and includes a chamber body 100, a cover body 1001, a holding member 11, a dielectric window 12, a coil 15, a gas supply system 20, a power supply unit and a bias power supply 13. The cover body 1001 is provided above the chamber body 100 of the reaction chamber 10, and accommodates the dielectric window 12, the coil 15 and the power supply unit therein. The holding member 11 is provided within the reaction chamber 10 and is used for holding the to-be-processed workpiece 14. The dielectric window 12 is provided on the chamber body 100 of the reaction chamber 10 and provided right above the holding member 11, and is made of an alumina ceramic, quartz, or other non-conductive material. An outer side of the dielectric window 12 is provided thereon with plural sets of coils 15 arranged at a certain interval in a vertical direction and wound around the dielectric window 12. The gas supply system 20 is used for introducing process gas into the reaction chamber 10, and includes an inlet line, and a pneumatic valve (not shown) and a mass flow controller (not shown) both provided on the inlet line, wherein the process gas is introduced into the reaction chamber 10 through the inlet line, the pneumatic valve is used for turning on and turning off the inlet line, and the mass flow controller is used for controlling flow rate of the process gas introduced into the reaction chamber 10. The power supply unit supplies power to the plural sets of coils 15, and includes a power supply 16 and a matcher 17, wherein the power supply 16 is connected to the coils 15, and supplies power to the coils 15 so as to generate an electromagnetic field in the reaction chamber 10 to excite the process gas introduced into the reaction chamber 10 into plasma. The matcher 17 is connected between the power supply 16 and the coils 15, and is used for adjusting load impedance of the power supply 16 such that the load impedance matches output impedance of the power supply 16, thus, power reflection of the power supply 16 is reduced, and output power of the power supply 16 can be fully applied to the coils 15. The bias power supply 13 is connected to the holding member 11 and is used for supplying a bias power to the holding member 11, so that a bias voltage is generated on the holding member 11 to attract the plasma to react chemically or physically with the to-be-processed workpiece 14 placed on the holding member 11.

Figure 3:
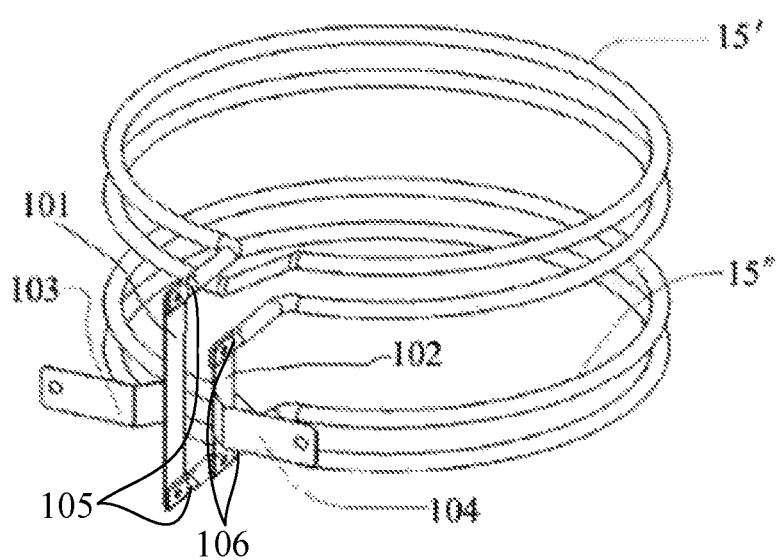
FIG. 3 is a schematic diagram illustrating connection between coils and a power supply according to an embodiment of the invention.
Figure 4:
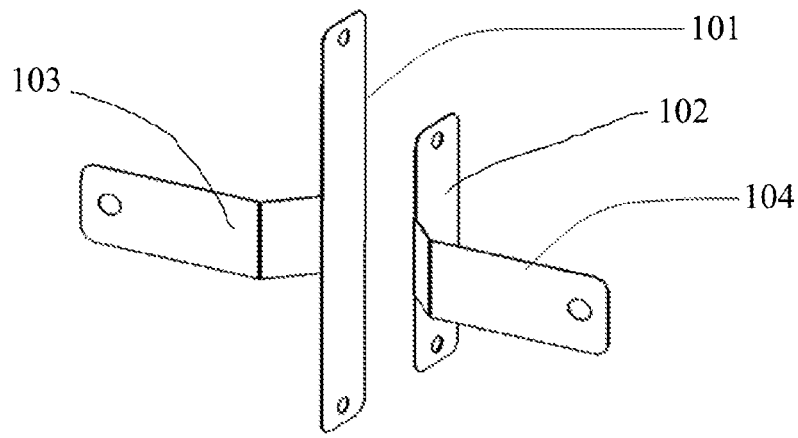
FIG. 4 is a schematic diagram illustrating arrangement positions of a first connection member, a second connection member, a third connection member and a fourth connection member according to an embodiment of the invention.
Figure 5:
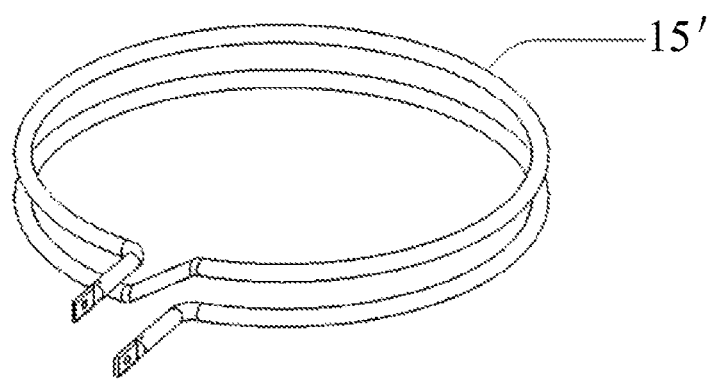
FIG. 5 is a schematic diagram of an upper coil according to an embodiment of the invention.
Figure 6:
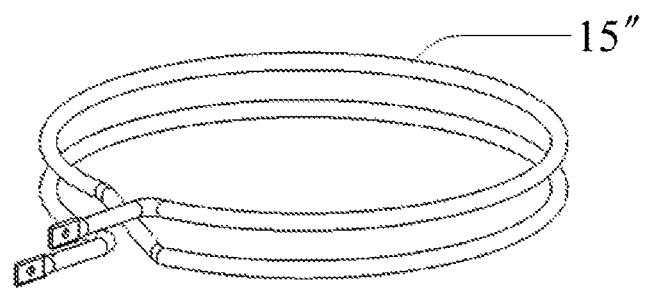
FIG. 6 is a schematic diagram of a lower coil according to an embodiment of the invention.

According to at least one embodiment, the power supply unit includes one power supply 16, and the plural sets of coils 15 are electrically connected to the power supply 16. Specifically; as shown in FIGS. 3 and 4, the reaction chamber 10 includes a first connection member 101, a second connection member 102, a third connection member 103 and a fourth connection member 104, wherein the first connection member 101 and the second connection member 102 are arranged in the vertical direction, first ends 105 of the plural sets of coils 15 are connected to the first connection member 101, and second ends 106 thereof are connected to the second connection member 102; two ends of the third connection member 103 are connected to the power supply 16 and the first connection member 101, respectively, and the fourth connection member 104 has one end connected to the second connection member 102 and the other end grounded. That is to say, the plural sets of coils 15 are connected in parallel. Moreover, for every set of coil 15, the direction from the first end 105 connected to the first connection member 101 to the second end 106 connected to the second connection member 102 is the same, i.e., winding directions of the plural sets of coils 15 are the same, so that current directions in the plural sets of coils 15 are the same when the power supply 16 supplies power to the plural sets of coils 15, so as to generate electromagnetic fields having a same direction.

According to at least one embodiment, during the process, process gas is introduced into the reaction chamber 10 through the inlet line and flows towards the holding member 11 from top to bottom. The process gas sequentially flows through areas corresponding to the plural sets of coils 15 during the flowing process thereof, and the plural sets of coils 15 ionize the process gas sequentially. Thereinafter, a process of generating plasma in the reaction chamber 10 is described by taking a case where the process gas is ionized by two sets of coils 15 as an example. Specifically, as shown in FIGS. 2, 3, 5 and 6, when the process gas flows to the area corresponding to the upper coil 15', the process gas is ionized in the electromagnetic field generated by the coil 15', wherein a small portion of the process gas is ionized into electrons and ions directly, and a larger portion of the process gas is ionized into free radicals; in the ionized process gas, content of the free radicals is generally 100 to 1000 times as large as that of the ions. The process gas continues flowing upwards after being ionized by the upper coil 15' for a first time, at this point, the process gas includes a small amount of ions and a large amount of free radicals, and includes a large amount of process gas that has not been ionized as well. When the process gas flows to the area corresponding to the lower coil 15", the process gas is ionized for a second time in the electromagnetic field generated by the coil 15"; during this ionization process, among the process gas that has not been ionized in the first ionization process, a small portion thereof is ionized into electrons and ions directly, and a larger portion thereof is ionized into free radicals; also, the free radicals obtained in the first ionization process is further ionized into electrons and ions during this ionization process.

It is known from the above that, both the coil 15' and the coil 15" ionize a part of the process gas into electrons and ions, so as to generate plasma in the reaction chamber 10. In practical applications, because the electromagnetic fields generated by the coils 15 in the reaction chamber 10 are generally non-uniform, generation rate of plasma in the area corresponding to each coil 15 is different. In general, the generation rate of plasma in an area corresponding to the axial center of each coil 15 is higher than that in an area close to the dielectric window 12 in the reaction chamber 10, and as a result, during the process, the plasma will diffuse, in a horizontal direction, from an area having a higher generation rate of plasma to an area having a lower generation rate of plasma. In addition, in the embodiment, since the coil 15' and the coil 15" are arranged at an interval, and no plasma is generated in an area between the coil 15' and the coil 15", the plasma in an area, in which generation rate of plasma is high, within the areas corresponding to the coil 15' and the coil 15" will diffuse to the area between the coil 15' and the coil 15", thus, the generation rate of plasma counterbalances outward diffusion rate of plasma in the area, in which generation rate of plasma is high, within the areas corresponding to the coil 15' and the coil 15", and densities of plasma in an area, in which generation rate of plasma is low, within the areas corresponding to the coil 15' and the coil 15" and in the area between the coil 15' and the coil 15' are improved, thereby improving distribution uniformity of the plasma in the reaction chamber 10.

In the process, according to at least one embodiment, the plasma is distributed evenly in the reaction chamber 10, which can reduce influence caused by skin currents in the plural sets of coils 15, and allow more of the power applied to the coils 15 by the power supply 16 to be used to generate electromagnetic fields in the reaction chamber 10 to excite the process gas into plasma, so that density of plasma in the reaction chamber 10 can be improved; meanwhile, higher power can be applied to the coils 15 by the power supply 16 due to the decreased skin currents, so that power capacity is improved.

In the meanwhile, in accordance with at least one embodiment, the output power of the power supply 16 is distributed to the plural sets of coils 15, so that power in each set of coil 15 is relatively low, which can reduce strengths of effects such as recombination of active particles in the plasma in an area surrounded by the dielectric window 12, ion bombardment on the dielectric window 12, optical radiation, and the like, and lower both temperature rise of the dielectric window 12 and temperature gradient of a surface of the dielectric window 12, so as to prevent the dielectric window 12 from cracking, thereby prolonging service life of the dielectric window 12.

In the reaction chamber according to at least one embodiment, the outer surface of the dielectric window 12 is provided thereon with plural sets of coils 15, which are arranged at an interval in the vertical direction, and wound around the dielectric window 12, so that process gas is ionized sequentially by the electromagnetic fields generated by the plural sets of coils 15 after being introduced into the reaction chamber 10, and moreover, during the process, the generated plasma diffuses in both horizontal direction and vertical direction, so that the plasma is distributed evenly in the reaction chamber 10, thereby improving uniformity of the process; in the meanwhile, by using the plural sets of coils 15 to ionize the process gas for plural times, ionization efficiency of the process can also be improved. In addition, in the reaction chamber provided by the embodiment, power for exciting plasma is applied to the plural sets of coils 15, respectively, so that the power in each set of coil 15 is relatively low, as a result, influence of skin currents in the plural sets of coils 15 can be reduced, and more of the power applied to the plural sets of coils 15 can be used for exciting plasma, thereby improving effective power applied to the coils 15; also, strengths of effects such as recombination of active particles in the plasma, ion bombardment on the dielectric window 12, optical radiation, and the like can be reduced, temperature rise and temperature gradient of the dielectric window 12 during the process can be lowered, so as to prevent the dielectric window 12 from cracking, and service life of the dielectric window 12 can thus be prolonged.

According to at least one embodiment, the number of turns of each set of coil 15 is plural; and a spacing between two adjacent sets of coils 15 is at least twice as long as that between two adjacent turns of the coil in each set of coil 15, in this way; there is enough space for the plasma in an area having a high generation rate of plasma to diffuse, so that the generation rate of plasma counterbalances the diffusion rate of plasma in the area, and thus the plasma is distributed evenly in the reaction chamber 10.

According to at least one embodiment, for each of the plural sets of coils 15, a cross section of each turn of the coil in a plane parallel to the axial direction of the coil may be in the shape of rectangle, ring or circle.

According to at least one embodiment, a position of the first connection member 101 where the first connection member 101 is connected with the third connection member 103 and a position of the second connection member 102 where the second connection member 102 is connected with the fourth connection member 104 are set according to currents required by the plural sets of coils 15. In a practical application, the position of the first connection member 101 where the first connection member 101 is connected with the third connection member 103 and/or the position of the second connection member 102 where the second connection member 102 is connected with the fourth connection member 104 may be determined according to practical requirements of a circuit. In the case where the position at which the first connection member 101 is connected with the third connection member 103 is different from the position at which the second connection member 102 is connected with the fourth connection member 104, the circuits in which the plural sets of coils 15 are respectively arranged have different resistances, and thus have different currents. In the embodiment, by setting the position at which the first connection member 101 and the third connection member 103 are connected and the position at which the second connection member 102 and the fourth connection member 104 are connected, the currents in the circuits in which the plural sets of coils 15 are respectively positioned can be changed, further strengths of the electromagnetic fields generated by the plural sets of coils 15 can be changed, and ultimately, plasma excitation efficiency of the plural sets of coils 15 can be adjusted. Preferably, in the embodiment, one end of the third connection member 103 is connected to a middle position of the first connection member 101; and one end of the fourth connection ember 104 is connected to a middle position of the second connection member 102.

It should be noted that in accordance with at least one embodiment, the power supply unit includes one power supply 16, the plural sets of coils 15 are connected in parallel and connected to the power supply 16, but the embodiments of the invention are not limited thereto. In practical applications, the number of the power supplies 16 may be plural, and the number of the matchers 17 corresponds to the number of the power supplies 16, and each power supply 16 is electrically connected to more than one set of coil 15 via one matcher 17. Moreover, for each power supply 16, the more than one set of coil 15 corresponding thereto has a same winding direction, so that the current direction in each set of coil 15 is the same when the power supply 16 supplies power to the more than one set of coil 15, so as to generate an electromagnetic field having a same direction.

According to another embodiment, there is provided a plasma processing apparatus, including a reaction chamber, which is the reaction chamber according to various embodiments of the invention.

In the plasma processing apparatus according to at least one embodiment, by adopting the above reaction chamber according to various embodiments of the invention, plasma is distributed evenly in the reaction chamber, and density of plasma in the reaction chamber is improved, thereby improving both uniformity and efficiency of the process; meanwhile, effective power for exciting plasma can be improved, and both temperature rise and temperature gradient of the dielectric window during the process can be lowered, so as to prevent the dielectric window from cracking, thereby prolonging the service life of the dielectric window.

Embodiments of the invention provide non-obvious advantages over the conventional art. For example, in the reaction chamber according to various embodiments of the invention, the outer side of the dielectric window is provided with plural sets of coils, which are arranged at an interval in the vertical direction and wound around the dielectric window, so that process gas is ionized sequentially by electromagnetic fields generated by the plural sets of coils after being introduced into the reaction chamber, moreover, during the process, the generated plasma diffuses in both horizontal direction and vertical direction, so that the plasma is distributed evenly in the reaction chamber, and thus uniformity of the process can be improved; in the meanwhile, by using the plural sets of coils to ionize the process gas for plural times, ionization efficiency of the process can also be improved. In addition, in the reaction chamber according to various embodiments of the invention, power for exciting plasma is applied to the plural sets of coils, respectively, so that the power in each set of coil is relatively low, as a result, influence of skin currents in the plural sets of coils can be reduced, and more of the power applied to the plural sets of coils can be used for exciting plasma, thereby improving effective power applied to the coils; also, strengths of effects such as recombination of active particles in the plasma, ion bombardment on the dielectric window, optical radiation, and the like can be reduced, and temperature rise and temperature gradient of the dielectric window during the process can be lowered, so as to prevent the dielectric window from cracking, and service life of the dielectric window can thus be prolonged.

In the plasma processing apparatus according to various embodiments of the invention, by adopting the above reaction chamber provided by various embodiments of the invention, plasma is distributed evenly in the reaction chamber, and density of plasma in the reaction chamber is improved, thereby improving both uniformity and efficiency of the process; meanwhile, effective power for exciting plasma can be improved, and both temperature rise and temperature gradient of the dielectric window during the process can be lowered, so as to prevent the dielectric window from cracking, and prolong the service life of the dielectric window.

Terms used herein are provided to explain embodiments, not limiting the invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the invention may suitably comprise, consist or consist essentially of the elements disclosed and may be practiced in the absence of an element not disclosed. According to at least one embodiment, it can be recognized by those skilled in the art that certain steps can be combined into a single step.

The terms and words used in the specification and claims should not be interpreted as being limited to typical meanings or dictionary definitions, but should be interpreted as having meanings and concepts relevant to the technical scope of the invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular founts"a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

It could be understood that the above implementations are exemplary implementations used for describing the principle of the embodiments of the invention only, but the embodiments of the invention are not limited thereto. For those skilled in the art, various variations and modifications may be made without departing from the spirit and substance of the embodiments of the invention, and these variations and modifications are also considered as falling into the protection scope of the embodiments of the invention.

The invention claimed is:

1. A reaction chamber, comprising: a chamber body; a dielectric window; a power supplier; and
    a first connection member, a second connection member, a third connection member, and a fourth connection member, wherein:
    the dielectric window is provided on top of the chamber body along a vertical direction and hermetically connected with the chamber body,
    each coil of a plurality of sets of coils is wound around an outer surface of the dielectric window at an interval along the vertical direction,
    the plurality of sets of coils are connected in parallel,
    the plurality of sets of coils include first ends that are electrically coupled to the power supplier for supplying power to each set of the plurality of sets of coils, the first ends being arranged along the vertical direction,
    the plurality of sets of coils include second ends that are grounded, the second ends being arranged along the vertical direction,
    the first ends of the plurality of sets of coils are connected to the first connection member arranged vertically, the second ends of the plurality of sets of coils are connected to the second connection member arranged vertically, a length of the second connection member is shorter than a length of the first connection member, and the second ends of the plurality of sets of coils are arranged between the first ends of the plurality of sets of coils along the vertical direction, and
    the third connection member is connected with the first connection member at a first position of the first connection member, and the fourth connection member is connected with the second connection member at a second position of the second connection member, the first position and the second position being arranged within a spacing between two adjacent sets of the plurality of sets of coils, thereby improving distribution uniformity of plasma generated in the reaction chamber.

2. The reaction chamber according to claim 1, wherein the power supplier comprises a power supply and a matcher, and the plurality of sets of coils are connected to the power supply via the matcher.

3. The reaction chamber according to claim 2, wherein a number of the power supply is one, the plurality of sets of coils are electrically connected to the power supply, winding directions of the plurality of sets of coils are the same, and current flow in each set of coils has a same direction when the power supply supplies power to the plurality of sets of coils.

4. The reaction chamber according to claim 3,
    wherein the first connection member is coupled to the power supply via the third connection member; and the second connection member is grounded via the fourth connection member.

5. The reaction chamber according to claim 4, wherein the first position of the first connection member at which the first connection member is connected to the third connection member and the second position of the second connection member at which the second connection member is connected to the fourth connection member are set according to currents required by the plurality of sets of coils.

6. The reaction chamber according to claim 4, wherein one end of the third connection member is connected to a middle position of the first connection member; and one end of the fourth connection member is connected to a middle position of the second connection member.

7. The reaction chamber according to claim 1, wherein a number of turns in each set of coils is plural, and
    wherein the spacing between the two adjacent sets of the plurality of set of coils is at least twice of a distance between two adjacent turns of the coils in each set of the plurality of sets of coils.

* * * * *